United States Patent

Saeki

[15] 3,659,120

[45] Apr. 25, 1972

[54] SWITCHING CIRCUIT

[72] Inventor: Yoshifumi Saeki, Tokyo, Japan

[73] Assignee: Pioneer Electronic Corporation, Tokyo, Japan

[22] Filed: July 29, 1970

[21] Appl. No.: 59,168

[30] Foreign Application Priority Data

July 29, 1969 Japan....................................44/71358

[52] U.S. Cl...............................................307/253, 307/259

[51] Int. Cl.........................................................H03k 17/00

[58] Field of Search....................307/259; 328/99, 173, 182; 325/348; 179/15 W

[56] References Cited

UNITED STATES PATENTS

| | | | |
|---|---|---|---|
| 2,572,179 | 10/1951 | Moore | 328/173 |
| 2,933,689 | 4/1960 | Johnson | 307/259 X |
| 3,365,546 | 1/1968 | Kemper | 179/15 W |

*Primary Examiner*—Donald D. Forrer
*Assistant Examiner*—B. P. Davis
*Attorney*—Sughrue, Rothwell, Mion, Zinn & Macpeak

[57] ABSTRACT

A switching circuit with two control terminals, one coupled to the base of a transistor receiving input signals and the other to the emitter of the transistor. The switching circuit is operated such that when a positive potential is applied to one of the control terminals, a null potential is applied to the other.

3 Claims, 3 Drawing Figures

SWITCHING CIRCUIT

BACKGROUND OF THE INVENTION

The invention is in the field of switching circuits and, in particular, to switching circuits which transmit or interrupt input signals in a signal transmission circuit. Such switching circuits find wide and varied use in the electronics art. A few examples are outlined below.

In receiver circuits, particularly in FM receiver circuits, muting circuits are utilized to block the operation of the audio frequency amplifier or the amplifiers in the IF stage during times when the receiver is untuned. Thus, the amplifiers are operated only during the time the receiver is tuned. Such operation results in the elimination of jarring noise at the output of the receiver generated during the intervals when the receiver is untuned. These muting circuits utilize switching circuits to accomplish the blocking operation.

In addition, transistor amplifiers utilize output transistor protection circuitry coupled to the output transistor to protect this transistor from breakdown when its output terminals are shortened. Such output transistor protection circuitry includes means for automatically interrupting input signals when the output transistor is shorted. Switching circuits are here utilized to accomplish the blocking of the input signals.

A further type of circuitry where switching circuits are utilized is selection circuitry wherein a plurality of input signals are applied to a plurality of input terminals with the selection circuitry selecting the desired input signals. Such circuitry uses a switching circuit which permits a select number of input signals to pass while interrupting the other signals.

Prior switching circuits used in the above environment have included a coupling capacitor in the input circuit. These prior switching circuits suffer the disadvantage that when the coupling capacitor was made small, a loud click noise was generated each time the switching circuit was switched off to block input signals. One prior method of reducing the click noise involved making the capacitor large. However, such an approach caused the switching circuit, when it was turned on, to generate an output signal which progressively became smaller and distorted.

SUMMARY OF THE INVENTION

The present invention alleviates the problems of the prior switching circuits by providing a switching circuit in which no click noise is generated at the interruption of an input signal while at the same time protects the input signal from becoming smaller and distorted when the switching circuit is turned on. To accomplish this, the switching circuit of this invention is provided with two control terminals, one coupled to the base of a transistor in the switching circuit and the other to its emitter. The circuit is operated such that when a positive potential is applied to one of the control terminals, a null potential is applied to the other.

DESCRIPTION OF THE PREFERRED EMBODIMENT

Figure 1:
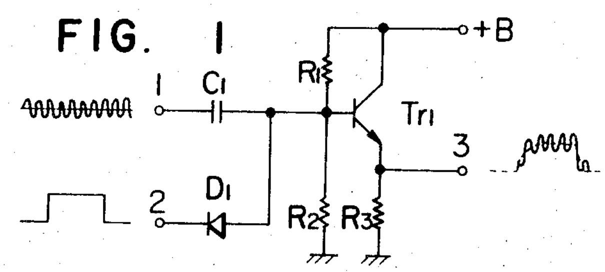
FIG. 1 shows a prior switching circuit.

FIG. 1 is a representation of a prior switching circuit. An input signal is applied at terminal 1 to the base of the transistor $TR_1$ through a coupling capacitor $C_1$. When the control terminal 2 is at a null potential, that is, a potential sufficient to forward bias diode $D_1$, the input terminal is shorted, thus preventing the input signal from appearing at the output terminal 3. When the potential on terminal 2 is raised so as to reverse bias diode $D_1$, the input signal appears at the output terminal 3, providing the transistor $TR_1$ is properly biased by resistors $R_1$ and $R_2$ as is known in the art.

When the potential at terminal 2 is again dropped to the null potential, diode $D_1$ forward biases and thus capacitor $C_1$ discharges through the diode $D_1$. When this occurs, transistor $TR_1$ is turned OFF and the signal on output terminal 3 disappears. However, if the capacity of capacitor $C_1$ is small, a large click noise is generated due to the fact that the potential at the output terminal 3 drops abruptly at the interruption of the input signal. If, on the other hand, the capacity of the capacitor $C_1$ is large, there is no click noise due to the fact that the potential at the base of transistor $TR_1$ drops gradually, thereby preventing an abrupt drop in the potential at the output terminal 3. However, if the capacitor $C_1$ is made large, as transistor $TR_1$ turns on, successively passing through class A, B, and C operation, the output signal becomes smaller and smaller and becomes more and more distorted.

Figure 2:
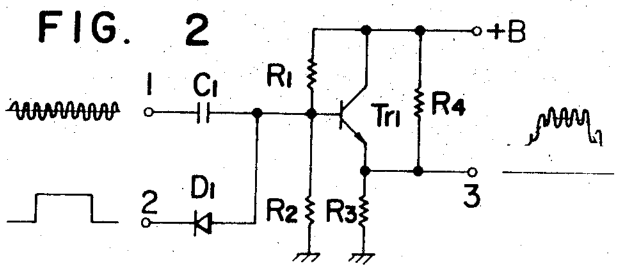
FIG. 2 shows another prior switching circuit which is an improvement over the circuit shown in FIG. 1.

A prior means which has been used to lessen the click noise is illustrated in FIG. 2. Like elements in FIGS. 1 and 2 are denoted by common numerals. In the circuit of FIG. 2, a resistor $R_4$ is added across the collector-emitter terminals of transistor $TR_1$. In this manner, a constant bias voltage is applied to the output terminal 3. When an input signal is interrupted, the potential at the output terminal 3 does not become zero but instead drops to the bias potential determined by resistor $R_4$. Neither the circuits shown in FIGS. 1 nor 2 solve the problem associated with eliminating the click noise while at the same time assuring that the input signal does not slowly decay while becoming gradually distorted.

Figure 3:
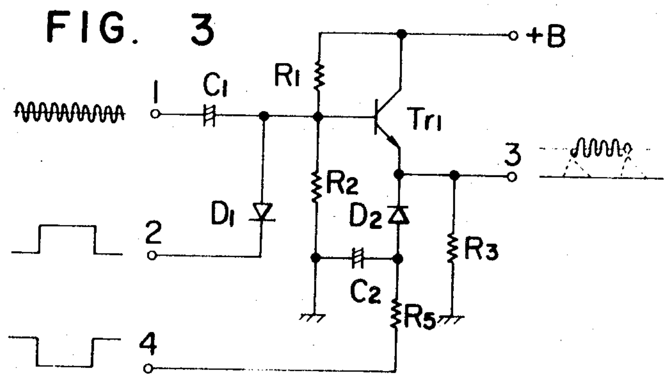
FIG. 3 is a circuit diagram for a switching circuit in accordance with the teachings of the present invention.

A switching circuit incorporating the teachings of this invention is illustrated in FIG. 3. Such a circuit provides for the elimination of the click noise while at the same time assures that the input signal does not become distorted or decay when the transistor $TR_1$ is turned on. Like elements in FIGS. 1, 2 and 3 are designated by common numerals. As in prior art switching circuits, input signals are applied to terminal 1 through a coupling capacitor $C_1$ to the base of the transistor $TR_1$. A first control terminal 2 is coupled through diode $D_1$ to the base of the transistor $TR_1$. Biasing resistors $R_1$ and $R_2$ provide proper operation of the transistor during those times when the control signal at terminal 2 reverse biases diode $D_1$.

A second control terminal 4 is coupled through a time constant circuit, comprising resistor $R_5$ and capacitor $C_2$, and diode $D_2$ to the output terminal 3 of the switching circuit. The time constant circuit is coupled to the output terminal 3 of the transistor $TR_1$ to assure that the output potential does not drop abruptly when the potential at terminal 4 drops to a null level.

Capacitor $C_1$ is made large so that the impedance does not become so large as to disrupt operation of the circuit for low frequency input signals. The potential at the base of transistor $TR_1$ drops at a rate determined by the time constant of the base circuit of which capacitor $C_1$ is the primary capacitance.

Operation of the invention will now be described with reference to FIG. 3. When diode $D_1$ is blocked due to a positive potential at control terminal 2, the input signal at terminal 1 is seen at the output terminal 3 of the transistor $TR_1$. However, when the potential at terminal 2 drops to its null level, diode $D_1$ conducts thus blocking the input signal from the output terminal 3. When the control terminal 2 is at its null level, control terminal 4 is at a positive potential sufficient to forward bias diode $D_2$. When this occurs, capacitor $C_2$ is charged, and the potential at the output terminal 3 becomes positive through the diode $D_2$. When the potentials at control terminals 2 and 4 are reversed, that is, when the potential the control terminal 2 raises so as to block diode $D_1$ and the potential at control terminal 4 drops to back bias diode $D_2$, the input signal is once again applied to the base of transistor $TR_1$ and thus to the output terminal 3. However, due to the charge stored in capacitor $C_2$, the reversal of the potential at control terminal 4 does not cause an abrupt drop of the potential at terminal 3. Instead, the potential drops slowly determined by the time constant of the RC circuit comprising capacitor $C_2$ and resistor $R_5$.

By properly selecting the time constants of the base and the emitter circuits of transistor $TR_1$, the output at terminal 3 remains relatively constant even when the input signal to terminal 1 is blocked. That is, the time constants of the base and the emitter circuits are so selected that when the input signal is blocked, the capacitor $C_2$ substantially charges to a DC value equal to the DC value of the input signal before the potential on capacitor $C_1$ decays through diode $D_1$. Similarly, when the input signal is unblocked, by reverse biasing diode $D_1$, the potential across capacitor $C_2$ discharges through $R_5$ at a rate such that capacitor $C_1$ is charged before there is any substantial decay of the potential on capacitor $C_2$. In this manner, the DC level of the potential at the output terminal 3 remains substantially constant regardless of whether or not the input signal is blocked from input terminal 1.

In summary, the present invention provides a switching circuit wherein there is provided control terminals for the base and the emitter circuits of a transistor in a switching circuit, the switching circuit being located along a signal transmission line. When a positive potential (or null potential) is applied to one of the control terminals, a null potential (or positive potential) is applied to the other. One of the control terminals provides a control signal for selectively interrupting an input signal applied to the input terminal signal. To the other control terminal, there is supplied a potential equal to the DC potential of the input signal. When the input signal is interrupted, this DC potential is supplied to the output terminal. The circuitry of the present invention further provides for the removal of the defect that, when the input signal is interrupted, the output signal gradually decays while being distorted, even though the time constant due to the coupling capacitor in the input circuit is made large enough to remove the clicking noise. This latter defect in prior circuits is corrected by the addition to the circuit of means to keep the output signal at a substantially constant DC value at all times.

What is claimed is:

1. A switching circuit comprising:

a. a transistor in a signal transmission path, said transistor including a base, emitter and collector terminal, b. a first control terminal connected to the base of said transistor, c. a first diode connected between the first control terminal and the base of said transistor, d. an output terminal connected to the emitter of said transistor, said output terminal being grounded through a resistor, e. a second control terminal connected to said output terminal, f. a second diode and a time constant circuit connected between said second control terminal and said output terminal, and g. means connected to said first and second control terminals for selectively supplying a positive potential to one of said control terminals while simultaneously supplying a null potential to the other control terminal and for selectively supplying a positive potential to said other control terminal while simultaneously supplying a null potential to said one of said control terminals whereby, the D. C. potential at said output terminal is maintained at a substantially constant value irrespective of the presence or absence of an input signal.

2. A switching circuit comprising:

a. means, placed in the path of a signal transmission line, for selectively passing an input signal, b. an input terminal, connected to said means for selectively passing, for receiving said input signal, c. an output terminal connected to said means for selectively passing, d. a first control means connected to said input terminal for selectively blocking said input signal from entering said means for selectively passing, and e. a second control means connected to said output terminal for supplying a DC potential equal to the DC level of said input signal to said output terminal when said input signal is blocked and for removing said DC potential when said input signal is unblocked.

3. The switching circuit of claim 2, wherein said second control means includes a time constant circuit for maintaining said DC potential at said output terminal until said input signal, when unblocked, substantially reaches said DC level at said output terminal.

* * * * *